Feb. 20, 1968 D. A. FABEL ETAL 3,370,207

MULTILAYER CONTACT SYSTEM FOR SEMICONDUCTOR DEVICES INCLUDING GOLD AND COPPER LAYERS

Filed Feb. 24, 1964

INVENTORS:
ROBERT M. HUNTER,
DAVID A. FABEL,

BY

THEIR ATTORNEY.

United States Patent Office 3,370,207

Patented Feb. 20, 1968

3,370,207

MULTILAYER CONTACT SYSTEM FOR SEMICONDUCTOR DEVICES INCLUDING GOLD AND COPPER LAYERS

David A. Fabel, Hamden, Conn., and Robert M. Hunter, Skaneateles, N.Y., assignors to General Electric Company, a corporation of New York Filed Feb. 24, 1964, Ser. No. 346,868

2 Claims. (Cl. 317—234)

This invention relates to semiconductor devices of the junction type and more particularly to contact structures and means to form conductive connections to semiconductor bodies.

It is recognized that it is extremely important, but difficult, in many semiconductor devices to make electrical contact which provides good electrical and thermal conductivity and good mechanical strength. The problem is particularly acute when contact is to be made to thin diffused heat sensitive layers of semiconductive material (e.g. thin impurity diffused layers) and when location of the contact on the semiconductor surface is critical.

Prior methods of producing contacts on semiconductive bodies include conventional alloying or soldering techniques, pressure contacts with all their inherent drawbacks, plating to metalize the semiconductor and thin solder, plating the semiconductor and heating so that the plating material forms a solder or braze alloy and various arrangements of coating a contact element (sometimes multiple coatings) and then heating the contact element and semiconductive member so that the coating material (or materials) forms a solder or braze. When using conventional alloying or soldering techniques, the elevated temperatures required create problems with cooling stresses and degradation of device junctions. The cooling stress problem may be so severe as to cause pellet fracture. In addition, good wetting and control of contact location is a problem. Where the semiconductive body is metalized and then a solder used to make connections to the device, exact contact location is difficult to control and the elevated temperatures required to form a good joint can be detrimental to device parameters. When the semiconductive body is plated and then heated so that the plating material acts as a solder, degrading elevated temperatures are used and the plating material may react chemically with the semiconductive body unless the plating material is good. When gold is used for this purpose, the amount required to form a good bond makes very expensive contact. For the arrangement where a contact element is plated and then soldered or brazed to the semiconductive body, all the above disadvantages are likely to exist.

It is, therefore, an object of this invention to produce improved electrical contacts to semiconductive bodies.

The invention provides a means of producing contacts and a contact structure for semiconductive bodies which gives good adhesion and contact with shallow penetration, provides accurate location of contact, etch resistance, and low temperature processing.

These and other objects of the invention are attained in accordance with aspects of the invention by providing a multilayer deposit on the semiconductive body as a contact means. By selection of the combination of metals deposited penetration and other contact parameters are controlled. In one embodiment the layers comprise gold, copper and gold in that order. In another embodiment, gold, arsenic and copper are used and in still another, gold indium and copper is preferred.

The features which are believed to be characteristic of the invention are set forth with particularity in the appended claims. The invention itself, however, both as to its organization and advantages thereof may best be understood by reference to the following description taken in connection with the accompanying drawings in which:

Figure 1:
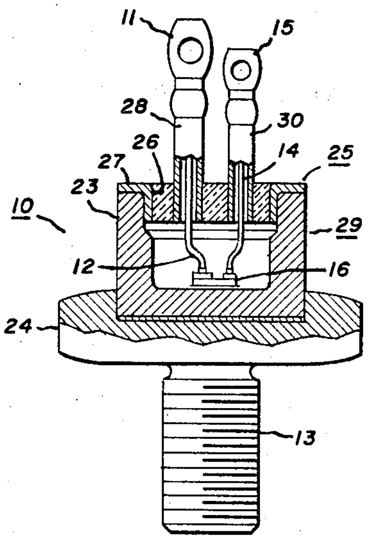
FIGURE 1 is a central vertical section through a semiconductor controlled rectifier utilizing contacts in accordance with teachings of the present invention.

In FIGURE 1 a semiconductor junction type rectifier of the type known as a silicon controlled rectifier is shown mounted in a sealed, self-contained unit or housing which is referred to generally by the reference character 10. The invention is shown and described in this setting because it is applied extensively to these devices and is particularly useful in the device illustrated. The operation of the silicon controlled rectifier illustrated is not described in detail here since a complete understanding of the operation of the device is not essential to an understanding of the invention and, further, the operation of such devices is discussed in a number of other places which are easily accessible. For example, the operation is described in chapter 1 of the General Electric Controlled Rectifier Manual, copyright 1960, by the General Electric Company. For this portion of the description, it should be sufficient to say that the main conduction path through the rectifier unit 10 is between an upper flat lead terminal 11 on the main or cathode conductive lead 12, a lower threaded bolt-like conductive terminal and heat sink 13 through the body of the device. Since current flow through the device takes place from the lower stud 13 through the body of the device to the upper conductive lead 12, the upper conductive lead 12 is frequently considered the device cathode and the lower stud 13 is considered the anode. Conduction does not take place (in any appreciable amount) in the opposite direction and the conduction which does take place is controlled in accordance with the characteristics of the device by a current (called a gate current) supplied to the rectifier through a gate lead 14 that extends out the top of the housing 29 adjacent to the cathode lead 12. The gate lead 14 is also provided with a flat conductive terminal 15 at its upper end.

Figure 2:
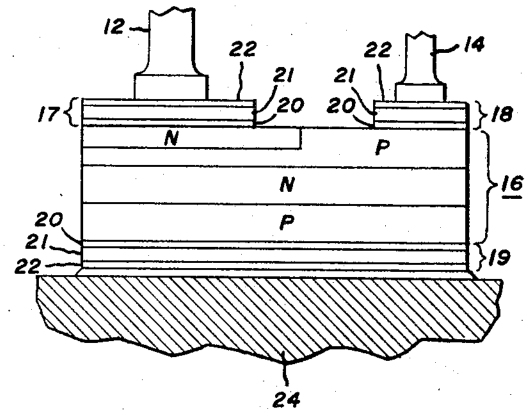
FIGURE 2 is an enlarged elevational view partially in section of the rectifying element (including connections) of the controlled rectifier of FIGURE 1.

The active control element of the device, that is, the part of the device which provides the rectifying and control action is the thin square rectifying semiconductor pellet 16 (best seen in FIGURE 2) which is an element in the main conduction path. The semicoductor pellet 16 is a monocrystalline semiconductor material (silicon in the device illustrated) with three junctions between four layers which are of alternate conduction types. That is, the four layers alternately have an excess of free electrons (N-type conduction characteristics) and an excess of positive poles (positive or P-type conduction characteristics). Such a device is described as a P-N-P-N semiconductor switch. The layers of the particular device are all diffused in. In the unit illustrated, the semiconductor pellet is 180 mils square and 9 mils thick. The thickness may best be visualized by considering that it is a little thinner than the pieces which would result from slicing a dime edgewise into four pieces of equal thickness. Obviously, such a thin piece of very brittle material is exeremely fragile and junction locations are quite critical. As a consequence, it is difficult to provide contacts to the device which do not cause undue mechanical strain in the fragile pellet or impair electrical characteristics of the pellet.

In order to meet the critical requirements for low resistance contacts to the semiconductor pellet 16, the present invention incorporates a system of multilayer deposited contacts which makes it possible to take advantage of the properties of several metals. At the same time, the system lends itself to a one cycle pass through a vapor plater and provides a contact which acts as a buffer to reduce transmission of stress from the device conductors (which are connected to the contacts) to the device of pellet 16.

Cathode and gate contacts 17 and 18 (see FIGURE 2) on the upper side of pellet 16 and anode contact 19 on lower side of the pellet 16 constitute a preferred contact structure and are formed by a preferred method. Since corresponding layers or laminations of each of the contacts 17, 18 and 19 are formed at one time they are, therefore, given corresponding reference numerals. In the embodiment illustrated here the first layer 20 (the layer on the pellet 16) of each contact is of gold and is approximately 0.01 mil thick, the second layer 21 (middle lamination) is an approximately 0.10 mil thick copper layer, and the outer layer 22 is another gold layer approximately 0.01 mil in thickness.

The preferred method of applying the contacts 17, 18 and 19 is to mask the semiconductor material (either in pellet or wafer form) by coventional masking techniques, (e.g. silicon dioxide) to leave exposed regions where contacts are to be formed. The semiconductor material is loaded in a commercially available vacuum vapor plating device. Charges of the plating metals are also placed in the furnace. The charges are in amounts and are placed at distances from the semiconductor material to be plated so that the plated layers each will be of the desired thickness. Calculations of amounts and placement can be made as taught in L. Holland, Vacuum De position of Thin Flms, published by John Wiley and Sons, Inc., New York (1956) and CEC Bulletin No. 14–3 entitled "Bibliography on Metal Evaporation and Sputtering," Consolidated Electro-dynamics Corporation, Rochester Division, Rochester 3, N.Y. For the device illustrated, the two charges of gold are placed in the esuipment to provide outer layers 20 and 22 of the contacts 17, 18 and 19 and one charge of copper which ultimately forms the middle layer 21. The charges are (as is conventional) placed in tungsten filaments which are fired in proper sequence (first gold, next copper, and then gold) in order to provide the proper sequence of layers on the semiconductor material.

After the contacts 17, 18 and 19 are formed the appropriate leads can be connected to each.

The anode contact 19 of the pellet 16 is connected to the copper stud 13 through part of the device housing 29. That is, the pellet 16 is mounted inside a cylindrical copper cup 23 by soldering the anode contact 19 to the bottom of the cup by a soft solder (e.g. 92.5% lead, 2.5% silver and 5% tin). The cup 23 in turn is soldered or brazed in a depression on an enlarged head or pedestal 24 provided on copper stud 13. The cathode lead 12 and gate lead 14 are soldered to their respective contacts 17 and 18 with the same or a similar solder in order to complete electrical connections to the pellet 16 and its contacts. Acually, the electrical connections are all made to the contacts 17, 18 and 19 at one time by placing the solder at the joints to be formed and heating to between 290 and 300° C. This temperature is under the gold-silicon eutectic of 377° C. so that the gold of the first layer 20 does not disturb the silicon which is important when bonding to a pellet with thin diffused heat sensitive layers. The lead and other constitutents of the solder scavenge (and bond well with) the outer gold layer 22 of the contacts but the internal copper layer 21 prevents the lead from disturbing the gold layer 20 which is adjacent the silicon. This arrangement not only provides a good mechanical bond and the electrical and heat transferring qualities desired for such a connection, but provides a buffer which prevents the transfer of stresses from external sources (e.g. copper cup 24) to the pellet 16.

In order to provide a hermetic enclosure and at the same time provide electrical connections to the cathode and gate terminals 11 and 15, a cap 25 is provided. The cap 25 has a cylindrical metal portion 26 which fits inside the upper end of metal cup 23 and is provided with an outwardly extending flange 27. The flange 27 is designed to fit on the upper edge of the cup 23 and be sealed thereto, as by soldering or brazing. An insulating material, such as glass, is provided inside the cylindrical metal portion 26 for the purpose of holding a cathode tubulation 28 and a gate tubulation 30 and to insulate these tubulations from the metal cup 23 when the device is assembled. The cathode and gate leads are brought up in their respective tabulations 28 and 30. After the housing 29 is evacuated, the tubulations 28 and 30 are pinched off to form good electrical connections with the leads (12 and 14) pressed therein and to form the device cathode and gate terminals 11 and 15 respectively.

Figure 3:
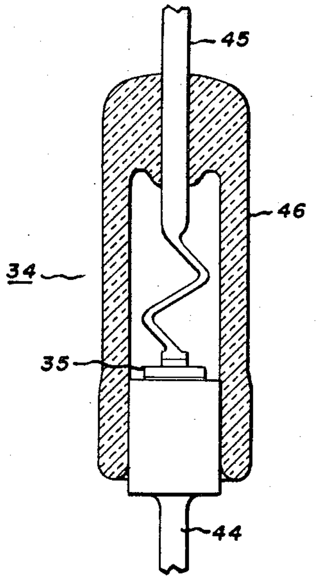
FIGURE 3 is a central vertical-longitudinal section through a rectifier of the type referred to as a zener diode which uses contacts according to the present invention.
Figure 4:
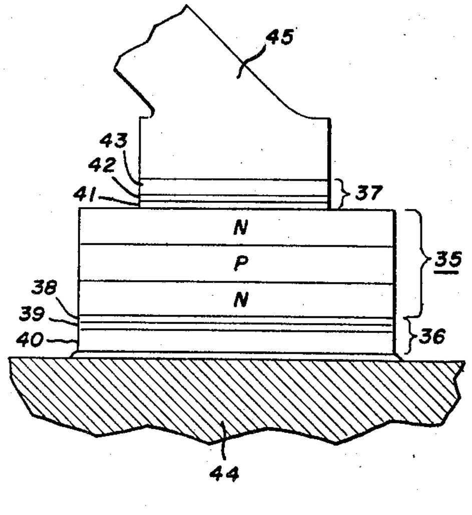
FIGURE 4 is an enlarged view of the rectifying element and connections thereto of the diode of FIGURE 3.

Other embodiments of the invention are used in the zener diode 34 illustrated in FIGURES 3 and 4. The part of the device which gives it the desired characteristics is a silicon pellet 35. The bulk material is P type and a shallow N type region is diffused in (see FIGURE 4). A lower contact 36 (lower in figure) is formed on the P type side and upper contact 37 is formed on the shallow diffused N type side. Both contacts are laminar formed and are by the vapor plating techniques previously described. In other words, both contacts are structured according to the concepts of the invention and constructed in accordance with the method concepts thereof. The lower contact 36 to the P type bulk material is made by a triple plating method as previously described. The first layer 38 (adjacent pellet 35) is gold (about 0.01 mil in thickness), the second or middle layer 39 is indium (about 0.01 mil in thickness), and the outer layer 40 is copper (about 0.10 mil thick).

The contact 37 to the N type diffused layer has a first layer 41 (adjacent the pellet 35) of gold (approximately 0.01 mil thick), an external layer 42 which may be either arsenic or antimony (approximately 0.01 mil thick) and an external layer 43 of copper (approximately 0.10 mil thickness).

External conduction 44 (lower as illustrated) and 45 for the device may advantageously be formed of materials such as fernico, molybenum, tungsten, etc. which have thermal coefficients of expansion that match the semiconductor material of the pellet 35 and which have reasonable electrical and thermal conductivities.

The device contacts 36 and 37 are soldered to the external connectors 44 and 45 with a suitable soft solder at low temperatures (lead or tin based solder) to provide good electrical and mechanical characteristics at low cost.

In order to provide a hermetic enclosure for the device, a glass cylinder 46 is sealed to both electrical connectors or leads 44 and 45.

While particular embodiments of the invention have been shown and described it will, of course, be understood that the invention is not limited thereto since many modifications varied to fit particular operating requirements and environments will be apparent to those skilled in the art. The invention may be used to perform similar functions and its peculiar properties taken advantage of in other semiconductor devices utilizing other materials than those described without departing from the concept of the invention. Accordingly, the invention is not considered limited to the examples chosen for the purposes of disclosure and it is contemplated that the appended claims will cover any such modifications as fall within the true spirit and scope of the invention.

What we claim as new and desire to secure by Letters Patent of the United States is:

1. A semiconductor device of the rectifying junction type requiring external electrical connection thereto including a body of semiconductor material and contact means comprising a first layer of gold bonded directly to said semiconductor body a layer of copper bonded directly to said first layer of gold and a second layer of gold bonded directly to said layer of copper.

2. A semiconductor device of the rectifying junction type requiring external electrical connection thereto including a body of semiconductor material and ohmic contact means comprising a first layer of gold bonded directly to said semiconductor material a second layer of at least one material selected from the group of arsenic, antimony and indium bonded directly to said layer of gold and a layer of copper bonded directly to said second layer.

References Cited

UNITED STATES PATENTS

| | | | |
|---|---|---|---|
| 2,814,589 | 11/1957 | Waltz | 317—240 X |
| 2,820,932 | 1/1958 | Looney | 317—240 |
| 2,829,422 | 4/1958 | Fuller | 317—235 |
| 3,000,085 | 9/1961 | Green. | |
| 3,006,067 | 10/1961 | Anderson et al. | 317—234 X |
| 3,007,092 | 10/1961 | Cooper | 317—240 |
| 3,028,663 | 4/1962 | Iwersen et al. | 29—195 |
| 3,185,935 | 5/1965 | White | 233—30 |

JOHN W. HUCKERT, *Primary Examiner.*

A. M. LESNIAK, *Assistant Examiner.*